United States Patent
Li et al.

(10) Patent No.: US 9,543,637 B2
(45) Date of Patent: Jan. 10, 2017

(54) THIN-FILM TRANSISTOR DISPLAY DEVICE HAVING INTEGRATED NFC ANTENNA

(71) Applicant: Truly Semiconductors Ltd., Guangdong (CN)

(72) Inventors: Jianhua Li, Guangdong (CN); Xuebin Chen, Guangdong (CN)

(73) Assignee: TRULY SEMICONDUCTORS LTD., Shanwei, Guangdong (CN)

( * ) Notice: Subject to any disclaimer, the term of this patent is extended or adjusted under 35 U.S.C. 154(b) by 95 days.

(21) Appl. No.: 14/389,239

(22) PCT Filed: Feb. 6, 2013

(86) PCT No.: PCT/CN2013/071448
§ 371 (c)(1),
(2) Date: Sep. 29, 2014

(87) PCT Pub. No.: WO2013/149519
PCT Pub. Date: Oct. 10, 2013

(65) Prior Publication Data
US 2015/0116166 A1 Apr. 30, 2015

(30) Foreign Application Priority Data

Apr. 6, 2012 (CN) .......................... 2012 2 0145136
Jul. 5, 2012 (CN) .......................... 2012 1 0232617

(51) Int. Cl.
*H01Q 1/24* (2006.01)
*H01Q 1/22* (2006.01)
(Continued)

(52) U.S. Cl.
CPC .......... *H01Q 1/2283* (2013.01); *G02F 1/1368* (2013.01); *G02F 1/13306* (2013.01);
(Continued)

(58) Field of Classification Search
CPC .......... H01Q 1/2283; H01Q 7/00; H01Q 1/40; G02F 1/133514; H04B 5/0081
(Continued)

(56) References Cited

U.S. PATENT DOCUMENTS 7,764,236 B2 * 7/2010 Hill ........................ H01Q 1/243
343/702
2008/0191959 A1 * 8/2008 Koyama .............. H01Q 1/2283
343/873
(Continued)

FOREIGN PATENT DOCUMENTS

CN 101114203 A 1/2008
CN 101308266 A 11/2008
(Continued)

*Primary Examiner* — Dameon E Levi
*Assistant Examiner* — Hasan Islam
(74) *Attorney, Agent, or Firm* — Knobbe Martens Olson & Bear LLP

(57) ABSTRACT

A thin-film transistor display device having integrated an NFC antenna (3). The NFC antenna (3) is arranged on a display screen (S) of the thin-film transistor display device, where the NFC interface is equipped with an output circuit of the display screen (S) and is connected to a control mainboard of the display screen (S). The thin-film transistor display device combines the display screen (S) and NFC antenna (3) features, and has the NFC antenna (3) provided directly on the thin-film transistor display device, thus preventing the problem of signal quality deterioration and reception failure due to wearing of the NFC antenna interface and inaccurate alignment, while facilitating reception and transmission of signals by the antenna, thus ensuring the smoothness of communication.

11 Claims, 3 Drawing Sheets

(51) Int. Cl.

| | | |
|---|---|---|
| *H01Q 1/44* | (2006.01) | |
| *H01Q 7/00* | (2006.01) | |
| *H01Q 1/40* | (2006.01) | |
| *H01Q 1/50* | (2006.01) | |
| *H05B 33/08* | (2006.01) | |
| *H01L 27/32* | (2006.01) | |
| *H04B 5/00* | (2006.01) | |
| *G02F 1/1333* | (2006.01) | |
| *G02F 1/1335* | (2006.01) | |
| *G02F 1/1368* | (2006.01) | |
| *H05K 1/18* | (2006.01) | |
| *G02F 1/133* | (2006.01) | |
| *G02F 1/167* | (2006.01) | |
| *G09G 3/34* | (2006.01) | |
| *H01L 27/12* | (2006.01) | |

(52) U.S. Cl.
CPC .... *G02F 1/13338* (2013.01); *G02F 1/133345* (2013.01); *G02F 1/133512* (2013.01); *G02F 1/133514* (2013.01); *G02F 1/167* (2013.01); *G09G 3/344* (2013.01); *H01L 27/124* (2013.01); *H01L 27/323* (2013.01); *H01L 27/3225* (2013.01); *H01Q 1/22* (2013.01); *H01Q 1/2258* (2013.01); *H01Q 1/2266* (2013.01); *H01Q 1/40* (2013.01); *H01Q 1/44* (2013.01); *H01Q 1/50* (2013.01); *H01Q 7/00* (2013.01); *H04B 5/0081* (2013.01); *H05B 33/0896* (2013.01); *H05K 1/181* (2013.01); *H05K 1/189* (2013.01); *G09G 2370/00* (2013.01); *H05K 2201/10098* (2013.01); *H05K 2201/10151* (2013.01)

(58) Field of Classification Search
USPC .......................... 343/741, 742, 788, 895, 873
See application file for complete search history.

(56) References Cited

U.S. PATENT DOCUMENTS

| | | | | |
|---|---|---|---|---|
| 2008/0309581 | A1* | 12/2008 | Fujii | H01Q 1/2225 343/873 |
| 2010/0182207 | A1* | 7/2010 | Miyata | H01L 27/13 343/702 |
| 2010/0260460 | A1* | 10/2010 | Harrysson | H01Q 1/1271 385/119 |
| 2011/0053556 | A1 | 3/2011 | Masaryk et al. | |
| 2012/0087065 | A1* | 4/2012 | Kim | G06F 1/1656 361/679.01 |

FOREIGN PATENT DOCUMENTS

| | | |
|---|---|---|
| CN | 101682111 A | 3/2010 |
| CN | 102076121 A | 5/2011 |
| CN | 202068693 U | 12/2011 |
| CN | 102749771 A | 10/2012 |
| CN | 102780792 A | 11/2012 |
| FR | 2950744 A1 | 4/2011 |
| JP | 2010-102531 A | 5/2010 |
| WO | 2013/149519 A1 | 10/2013 |

* cited by examiner

THIN-FILM TRANSISTOR DISPLAY DEVICE HAVING INTEGRATED NFC ANTENNA

This application is a National Stage application of PCT international application PCT/CN2013/071448, filed on Feb. 6, 2013 which claims priority to Chinese Patent Application No. 201220145136.8, entitled "DISPLAY SCREEN", filed with the Chinese Patent Office on Apr. 6, 2012; and Chinese Patent Application No. 201210232617.7, entitled "THIN-FILM TRANSISTOR DISPLAY DEVICE INTEGRATED WITH NFC ANTENNA", filed with the Chinese Patent Office on Jul. 5, 2012, which are incorporated by reference in their entireties herein.

FIELD OF THE TECHNOLOGY

The present application relates to the field of near field communication technology, particularly to a thin film transistor display integrated with an NFC antenna.

BACKGROUND

Near Field Communication (NFC) technology is a necessary technology for future electronic products, which may be applied widely. Most antennae of existing NFC products are fabricated at one side of a battery or attached inside a casing, generally by forming coils with metal wirings on a Printed Circuit Board (PCB) or on a Flexible Printed Circuit (FPC) and then attaching the PCB or the FPC with the coils to the battery or the casing. Disadvantage of the existing NFC products mainly include the followings. Due to repeated mounting and dismounting of the battery and the casing, abrasion or misalignment is easy to occur at a wiring junction of the NFC antenna, and thus a signal of the antenna is deteriorated and functions of the NFC product can not be used effectively. In addition, the antenna of the NFC product is usually located inside the casing of the electronic product. If a metallic material is selected to fabricate the casing, propagation of NFC signals may be affected. Therefore, sturdy metallic materials are limited when a material for the casing of an electronic product is selected.

For example, many electronic products equipped with an NFC antenna and a Thin Film Transistor Liquid Crystal Display (TFT-LCD) have the above problems. In TFT-LCD, thin film transistor technology is used to improve a video quality, which is an active matrix LCD and applied to TVs, flat panel displays and projectors. A TFT-LCD panel may be regarded as two pieces of glass substrates with a layer of liquid crystal sandwiched therebetween. A color filter is provided on a top glass substrate, and some transistors are formed on a bottom glass substrate. An electric field may be varied when a current flows through the transistors, causing deflection of liquid crystal molecules, thus changing the polarization of light. Then, a brightness of a pixel may be determined by using a polarizer. Further, the color filter is attached to the top glass, to form 3 colors including red, green and blue at each pixel. The pixels in red, green or blue compose a video picture on the panel.

An electronic product equipped with an NFC antenna and a thin film transistor display has an unreasonable arrangement of the NFC antenna, abrasion and misalignment are easy to occur at the wiring junction of the NFC antenna, and thus a signal of the antenna is deteriorated. In addition, a selection range for the casing of the electronic product is limited. However, it is possible to integrate an NFC antenna during fabrication of a thin film transistor display. In view of this, it is necessary to design a new thin film transistor display integrated with an NFC antenna, to solve the above problems.

SUMMARY

In view of this, a thin film transistor display integrated with an NFC antenna is provided according to the application, which may prevent the abrasion and the misalignment at a wiring junction of the antenna and ensure the quality of signals of the antenna. In addition, an electronic product equipped with the above TFT-LCD transmits signals from a front of the display; and therefore a selection of materials for a casing is not limited by the NFC antenna.

To solve the above technical problems, a technical solution is provided in the application, including: a thin film transistor display integrated with an NFC antenna, where the NFC antenna is disposed on a screen of the thin film transistor display, an NFC interface is built in an output circuit of the screen, and is connected to a control board of the screen.

Preferably, the screen includes in turn: a top substrate, a color filter, a transparent conductive layer, a liquid crystal layer, a TFT array and a bottom substrate, where the NFC antenna is connected to the TFT array.

Preferably, the NFC antenna is disposed on an inner side of the top substrate and located at a black matrix region of the filter, and an insulating protective layer is disposed between the NFC antenna and the transparent conductive layer.

Preferably, the NFC antenna is disposed on an outer side of the top substrate and an insulating protective layer is disposed outside the NFC antenna.

Preferably, the NFC antenna is disposed on an inner side of the bottom substrate and located at a surrounding region of the TFT array.

Preferably, the NFC antenna is disposed on an outer side of the bottom substrate.

Preferably, the NFC antenna is connected to a lead of the TFT array via a conductive material and is led to the output circuit of the screen, or is directly led to the output circuit of the screen.

Preferably, the NFC antenna is a multi-turn coil including wirings made of conductive material.

Preferably, the NFC antenna adopts the wiring of low resistivity material including silver, copper and aluminum.

Preferably, the multi-turn coil is wound into an annular matching a contour of a product.

Preferably, the multi-turn coil is wound into a rectangle or into a round shape.

Preferably, a side, closer to an interior of the display, of the multi-turn coil is covered with a layer of transparent ferrite material.

In contrast to the existing technology, in the thin film transistor display integrated with the NFC antenna according to the application, the NFC antenna is disposed directly on the thin film transistor display. An NFC interface is built in an output circuit of the screen, and then is connected to a control board. The NFC antenna is connected fixedly after the installation, which will not be mounted and dismounted frequently. Therefore, conventional problems that a quality of a signal is deteriorated and a reception of the signal fails in the existing NFC antenna due to the abrasion and misalignment of the interface are avoided. Further, solutions are provided for convenience of receiving NFC signals from a display surface of the display, or if it is necessary to receive NFC signals from a display surface of the display. In addition, an electronic product equipped with the above TFT-LCD transmits signals from a front side of the display, and thus the selection of material for the casing is not limited by the NFC antenna.

Figure 1:
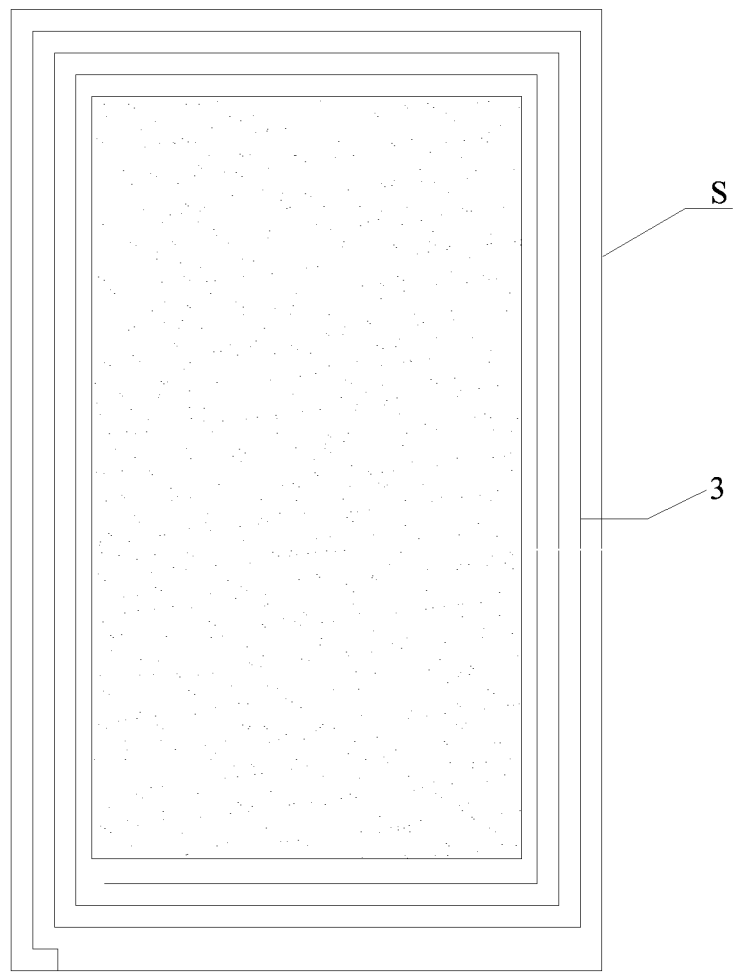
FIG. 1 is a front view of an installation position of an NFC antenna on a thin film transistor display in a first embodiment of a TFT display integrated with the NFC antenna according to the application.

Reference numerals in FIGS. 1-5:
1. top substrate; 2. color filter; 3. NFC antenna; 4. insulating protective layer; 5. conductive silver paste; 6. ITO layer; 7. liquid crystal layer; 8. TFT array; 9. bottom substrate.

DETAILED DESCRIPTION OF THE EMBODIMENTS

In a basic concept of the application, an NFC antenna is disposed on a screen of a thin film transistor display, where an NFC interface is built in an output circuit of the screen, and is connected to a control board of the screen.

For better understanding of the technical solution of the application by those skilled in the art, the application is described below in detail with a combination of drawings and embodiments.

First Embodiment

Figure 2:
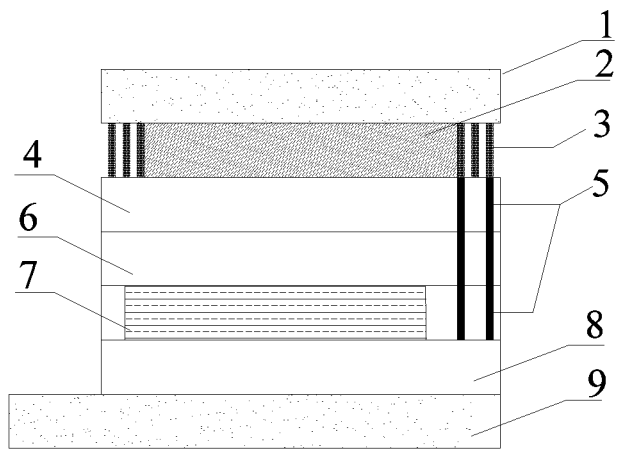
FIG. 2 is a side view of an installation structure of an NFC antenna in a first embodiment of a thin film transistor display integrated with the NFC antenna according to the application.

Referring to both FIG. 1 and FIG. 2, an installation structure of an NFC antenna in the first embodiment of a thin film transistor display integrated with the NFC antenna according to the application is shown. When looked from a top of a bottom in a direction of a human eye, a screen S of the thin film transistor display integrated with the NFC antenna in turn includes: a top substrate 1, a color filter 2, an ITO (Indium Tin Oxide) layer (or other transparent conductive layer) 6, a liquid crystal layer 7, a TFT array 8, and a bottom substrate 9, where an NFC antenna 3 is disposed under a Black Matrix (BM, to prevent low color purity, mostly made of multi-layer chromium thin film with low reflectivity) of the color filter 2.

A position of the NFC antenna 3 is shown in FIG. 2. The NFC antenna 3 is disposed at an inner side of the top substrate 1 and under the black matrix region (BM layer) of the color filter 2. An insulating protective layer 4 is disposed between the NFC antenna 3 and the ITO layer 6. The NFC antenna 3 is connected to a lead of the TFT array 8 via a conductive silver paste 5 or other conductive materials and then is led to the output circuit of the screen. Alternatively, the NFC antenna 3 is directly led to the output circuit of the screen. The NFC antenna 3 may include a multi-turn coil made with a wiring of metal (such as silver, copper or aluminum) or other materials with low resistivity (such as carbon). Then, the NFC antenna 3 is connected to the lead of the TFT array 8 via the conductive silver paste 5. The multi-turn coil is wound into a rectangle, a round shape, or an annular matching a contour of the display. A layer of transparent ferrite material is provided on (covers) a side, closer to an interior of the display, of the multi-turn coil, to enhance magnetic induction intensity. This kind of wiring can be achieved with existing devices without additional investment.

In addition, an antenna matching circuit (not shown in the figures) connected with the NFC antenna 3 is provided. The antenna matching circuit includes a charge and discharge module and an impedance module. The charge and discharge module is connected to the impedance module. The charge and discharge module includes capacitors in parallel or in series; and the impedance module includes resistors in parallel or in series. Thereby, a power matching of the NFC antenna 3 is achieved by disposing the antenna matching circuit.

Second Embodiment

Figure 3:
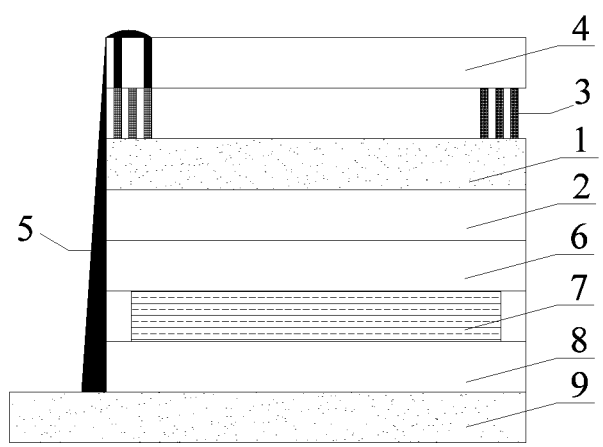
FIG. 3 is a side view of an installation structure of an NFC antenna in a second embodiment of a thin film transistor display integrated with the NFC antenna according to the application.

Referring to both FIG. 1 and FIG. 3, an installation structure of an NFC antenna in the second embodiment of a thin film transistor display integrated with the NFC antenna according to the application is shown. The NFC antenna 3 is disposed on an outer side of a top substrate 1. An insulating protective layer 4 is disposed outside the NFC antenna 3 The NFC antenna 3 includes a multi-turn coil made with wirings of metal (silver, copper or aluminium). The NFC antenna 3 is connected to a lead of the TFT array 8 via a conductive silver paste 5 or other conductive materials, and is led to an output circuit of the display. Alternatively, the NFC antenna 3 is directly led to an output circuit of the display. Other part of the structure is same to that in the first embodiment, which will not be repeated herein.

Third Embodiment

Figure 4:
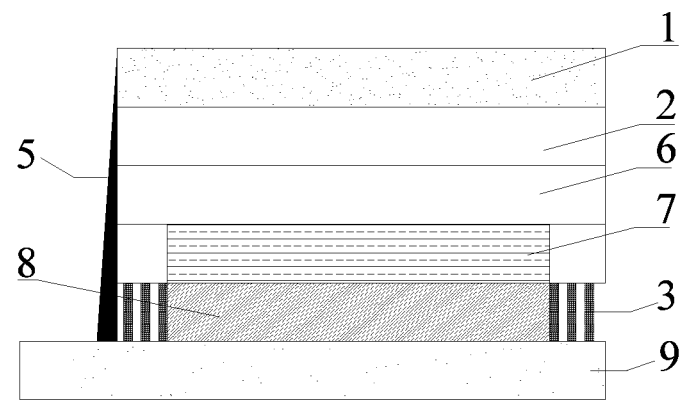
FIG. 4 is a side view of an installation structure of an NFC antenna in a third embodiment of a thin film transistor display integrated with the NFC antenna according to the application.

Referring to both FIG. 1 and FIG. 4, an installation structure of an NFC antenna in the third embodiment of a thin film transistor display integrated with the NFC antenna according to the application is shown. The NFC antenna 3 is disposed on an inner side of the bottom substrate 9, and is located at a periphery of the TFT array. Other part of the structure is same to that in the first and second embodiments, which will not be repeated herein.

Fourth Embodiment

Figure 5:
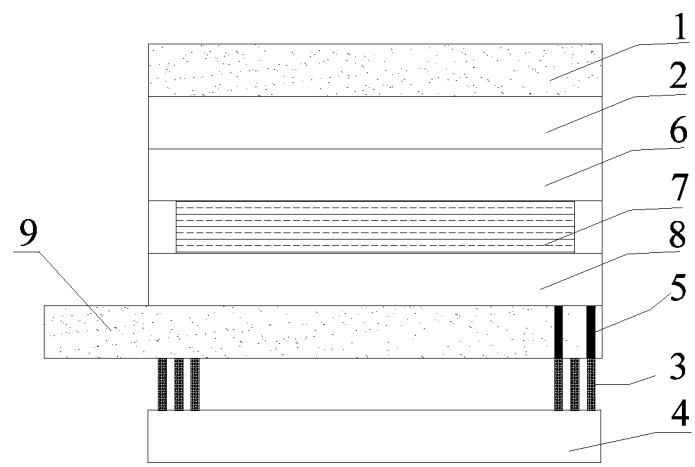
FIG. 5 is a side view of an installation structure of an NFC antenna in a fourth embodiment of a thin film transistor display integrated with the NFC antenna according to the application.

Referring to both FIG. 1 and FIG. 5, an installation structure of an NFC antenna in the fourth embodiment of a thin film transistor display integrated with the NFC antenna according to the application is shown. The NFC antenna 3 is disposed on an outer side of the bottom substrate 9. The NFC antenna 3 is connected to a lead of the TFT array 8 via a conductive silver paste 5 or other conductive materials and then is led to an output circuit of the display. Alternatively, the NFC antenna 3 is directly led to an output circuit of the display. An insulating protective layer 4 is disposed outside the NFC antenna 3 Other part of the structure is same to that in the first embodiment, which will not be repeated herein.

In the above embodiments, the NFC antenna is disposed directly on the thin film transistor display. An NFC interface of the NFC antenna includes an output circuit of the display and is connected to a control board (not shown in the figures). The NFC antenna is connected fixedly after an installation, which will not be mounted and dismounted frequently. Therefore, conventional problems that a reception of a signal fails in the existing NFC antenna due to the abrasion and misalignment of the interface are avoided. Further, solutions are provided for convenience of receiving NFC signals from a display surface of the display, or if it is necessary to receive NFC signals from a display surface of the display. In addition, an electronic product equipped with the above TFT-LCD transmits signals from a front side of the display, and thus a selection of materials for a casing is not limited by the NFC antenna.

In the thin film transistor display integrated with the NFC antenna according to the application, the display and the NFC antenna are integrated together, which is more competitive in markets.

Hereinbefore are merely preferable embodiments of the application. Note that, the aforesaid preferable embodiments should not be regarded as limitation to the application. A scope of the application is subject to the scope limited by the appended claims. For those skills in the art, improvements or retouches may be performed without departing from the spirit and scope of the application. These improvements and retouches should be regarded within the scope of the application.

What is claimed is:

1. A thin film transistor display integrated with a Near Field Communication (NFC) antenna, wherein the NFC antenna is disposed on a screen of the thin film transistor display, an NFC interface is built in an output circuit of the screen, and is connected to a control board of the screen,
   wherein the screen comprises in turn: a top substrate, a color filter, a transparent conductive layer, a liquid crystal layer, a TFT array and a bottom substrate, wherein the NFC antenna is connected to the TFT array,
   the NFC antenna is disposed on an inner side of the top substrate, and is located at a black light shielding region surrounding the color filter, and
   an insulating protective layer is disposed between the NFC antenna and the transparent conductive layer.

2. The thin film transistor display integrated with the NFC antenna according to claim 1, wherein the NFC antenna is connected to a lead of the TFT array via a conductive material and is led to the output circuit of the display, or is directly led to the output circuit of the display.

3. The thin film transistor display integrated with the NFC antenna according to claim 1, wherein the NFC antenna is a multi-turn coil comprising wirings made of conductive material.

4. The thin film transistor display integrated with the NFC antenna according to claim 3, wherein the multi-turn coil is wound into an annular matching a contour of a product.

5. The thin film transistor display integrated with the NFC antenna according to claim 3, wherein a side, closer to an interior of the display, of the multi-turn coil is covered with a layer of transparent ferrite material.

6. The thin film transistor display integrated with the NFC antenna according to claim 3, wherein the multi-turn coil is wound into a rectangle or into a round shape.

7. The thin film transistor display integrated with the NFC antenna according to claim 3, wherein the NFC antenna adopts the wiring of low resistivity material comprising silver, copper and aluminum.

8. The thin film transistor display integrated with the NFC antenna according to claim 1, wherein the NFC antenna is connected to a lead of the TFT array via a conductive material and is led to the output circuit of the display, or is directly led to the output circuit of the display.

9. The thin film transistor display integrated with the NFC antenna according to claim 4, wherein a side, closer to an interior of the display, of the multi-turn coil is covered with a layer of transparent ferrite material.

10. The thin film transistor display integrated with the NFC antenna according to claim 4, wherein the multi-turn coil is wound into a rectangle or into a round shape.

11. The thin film transistor display integrated with the NFC antenna according to claim 4, wherein the NFC antenna adopts the wiring of low resistivity material comprising silver, copper and aluminum.

\* \* \* \* \*